United States Patent
Mathew et al.

(10) Patent No.: US 7,131,055 B2
(45) Date of Patent: Oct. 31, 2006

(54) FAST BIT-PARALLEL VITERBI DECODER ADD-COMPARE-SELECT CIRCUIT

(75) Inventors: Sanu K. Mathew, Hillsboro, OR (US); Ram Krishnamurthy, Portland, OR (US); Hoang Q. Dao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 555 days.

(21) Appl. No.: 10/372,121

(22) Filed: Feb. 25, 2003

(65) Prior Publication Data

US 2004/0177304 A1 Sep. 9, 2004

(51) Int. Cl.
*H03M 13/03* (2006.01)

(52) U.S. Cl. .................. 714/795; 375/262; 375/341

(58) Field of Classification Search ............... 375/262, 375/341

See application file for complete search history.

(56) References Cited

U.S. PATENT DOCUMENTS

| | | | | |
|---|---|---|---|---|
| 6,263,473 B1* | 7/2001 | Kamada | ................. | 714/795 |
| 6,298,464 B1 | 10/2001 | Tong et al. | ................. | 714/795 |
| 6,343,103 B1 | 1/2002 | Lou et al. | ................. | 375/261 |
| 6,343,105 B1 | 1/2002 | Saegusa | ................. | 375/341 |
| 6,445,755 B1 | 9/2002 | Chung et al. | ................. | 375/341 |
| 2002/0116682 A1* | 8/2002 | Brick | ................. | 714/795 |
| 2002/0169990 A1* | 11/2002 | Sherburne | ................. | 713/300 |
| 2005/0149838 A1* | 7/2005 | Chiueh et al. | ................. | 714/795 |

OTHER PUBLICATIONS

The American Heritage® Dictionary of the English Language, Fourth Edition; entry for "should"; Copyright © 2000 by Houghton Mifflin Company; URL: http://www.bartleby.com/61/83/S0368300.html.*

Merriam-Webster Online Dictionary; entry for "shall" © 2005-2006 Merriam-Webster, Incorporated; URL: http://www.m-w.com/dictionary/should.*

Law.com dictionary; entry for "shall"; Copyright 2006 ALM Properties, Inc. All rights reserved.; URL: http://dictionary.law.com/default2.asp?typed=shall&type=1&submit1.x=76&submit1.y=8&submit1=Look+up.*

Chang et al., A 2-Mb/s 256-State 10-m W Rate-⅓ Viterbi Decoder, Jun. 2000, p. 826-834, IEEE Journal of Solid-State Circuits, vol. 35, No. 6.

Yeung et al., A 210MbIs Radix-4 Bit-level Pipelined Viterbi Decoder, 1995, p. 88-90, 1995 IEEE International Solid State Circuits Conference.

* cited by examiner

*Primary Examiner*—R. Stephen Dildine
(74) *Attorney, Agent, or Firm*—Fleshner & Kim, LLP

(57) ABSTRACT

A Viterbi decoder includes an ACS unit that performs state metric updates for every symbol cycle. State metric updates involve adding the state metrics corresponding to a likely input symbol to the respective branch matrix, comparing the results of the additions to determine which is smaller, and selecting the smaller result for the next state metric. The ACS unit includes two parallel adders followed by a parallel comparator that generates a multiplexer-select signal. The outputs of the parallel adders are input into a multiplexer and the multiplexer-select signal is input into the multiplexer for a decision.

28 Claims, 11 Drawing Sheets

US 7,131,055 B2

FAST BIT-PARALLEL VITERBI DECODER ADD-COMPARE-SELECT CIRCUIT

BACKGROUND OF THE INVENTION

1. Field of the Invention

The present invention relates generally to add-compare-select circuits, and more specifically to fast bit-parallel add-compare-select circuits for Viterbi decoders.

2. Background of the Related Art

Viterbi decoders are used in a wide range of communications and data storage applications, and are known to be the performance-limiting units in wireless DSP cores. The add-compare-select (ACS) circuit of the Viterbi decoder generally sets the performance of the unit. Thus, the overall speed of a Viterbi decoder is largely determined by the ACS computation time.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
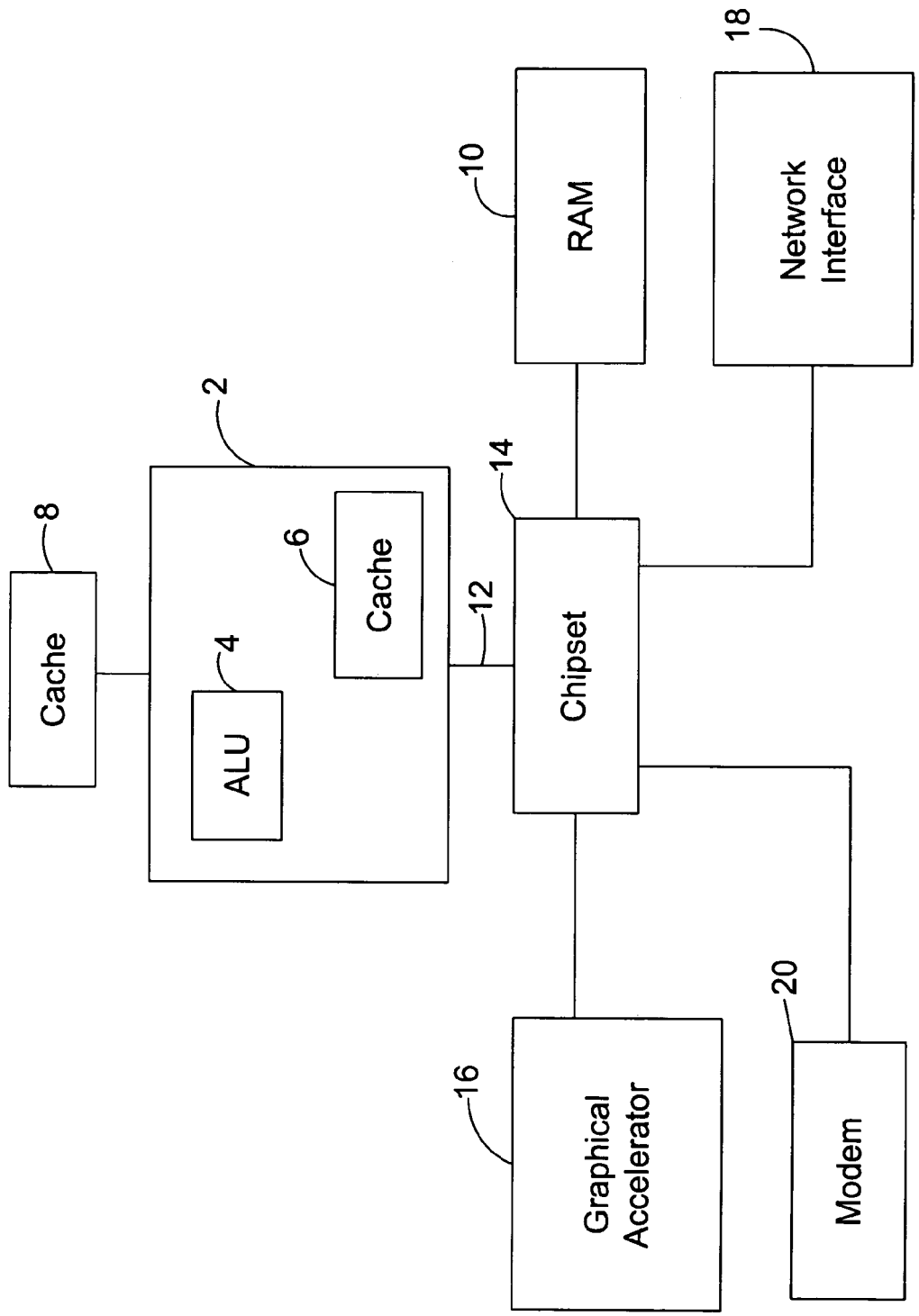
FIG. 1 illustrates an example of a computer system.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Forward error correction (FEC) is a commonly used technique to improve the capacity of a transmission channel by adding some carefully designed redundant information to the data being transmitted through the channel. The process of adding this redundant information is known as channel coding. Convolutional coding is one form of channel coding. Convolutional codes operate on serial data, one or a few bits at a time. There are a variety of useful convolutional codes and a variety of algorithms for decoding the received coded information sequences to recover the original data. One method of decoding is the Viterbi decoding method. The present invention relates to a Viterbi decoding method for a fast bit-parallel high performance Viterbi decoder.

The following embodiments of the invention relate to a Viterbi decoding method for use on data encoded by a convolutional encoding scheme. Convolutionally encoding data involves taking binary data that is to be transmitted through a channel and encoding the data using a convolutional encoding technique. Convolutionally encoding the data will result in the generation of channel symbols that can be transmitted over a transmission channel. One example of convolutionally encoding data is accomplished using a shift register and associated combinatorial logic that performs modulo-two addition. The combinatorial logic can be in a form of cascaded exclusive-or gates. Convolutional encoding will take each binary data bit and transform it into a two-bit channel symbol.

The convolutional encoder acts as a simple state machine. The number of states in the encoder depends on the convolutional encoding technique used. For example, an encoder with two bits of memory will result in a state machine with 4 possible states. The state machine transitions from a current state to a next state based on the value of the current state and the input. These transitions are typically expressed in a table called a state transition table. The state transition table is used in conjunction with another table called the output table. The output table is similar to the state transition table in that it describes the output symbol of the convolutional encoder based on the current state of the encoder and the input to the encoder for a particular binary data bit. These two tables will describe the behavior of the convolutional encoder wherein a binary data bit is transitioned through the encoder resulting in a two bit channel symbol output. These channel symbols are then mapped to signal levels and transmitted over a transmission channel. The Viterbi decoder receives the channel symbol data from the signal and decodes the channel symbols to reconstruct the data that was encoded.

The Viterbi decoder uses the Viterbi algorithm. Each time the decoder receives a pair of channel symbols, the decoder computes a metric to measure the "distance" between what was received and all the possible channel symbol pairs that could have been received. This is based on the output table associated with the particular convolutional encoding technique used to encode the data. One example of the metric used to measure the distance is the Hamming distance, which describes the distance between the received channel symbol pair and the possible channel symbol pairs. The Hamming distance is computing by simply counting how many bits are different between the received channel pair and the possible channel pairs. The result can only be 0, 1, or 2 for a 2-bit channel symbol.

The Hamming distance (or other metric) values computed at each time instant for the paths between the states at the previous time instant and the states at the current time instant are called branch metrics. For the first time instant, the decoder saves the results as an accumulated error metric value. For subsequent time instances, the accumulated error metrics will be computed by adding the previous accumulated error metrics to the current branch metrics. This can be best understood by constructing a trellis diagram for the encoding and decoding techniques used.

The decoder stores the number of predecessor states that led to each of the current states at each instant of time. The branch metric values of the new state are added to the previous accumulated error metric values associated with each state that led to the current state. The decoder compares the accumulated error metrics associated with each branch and discards the larger one of each pair of branches leading into a given state. If the values of the accumulated error metrics going into a particular state are equal, the value is just saved. In addition, for each state, the predecessor that survives is the one with the lower branch metric. If two accumulated error metrics are equal, one branch is arbitrarily picked.

The operation of adding the previous accumulated error metrics to the new branch metrics, comparing the results, and selecting the smaller (smallest) accumulated error metric to be retained for the next time instance is called the add-compare-select operation. The path associated with the smallest accumulated error metric is the path that the Viterbi decoder exploits to recover the original message.

In short, the decoding process begins with building the accumulated error metric for some number of received channel symbol pairs, and their history of what states preceded the states at each time instant t with the smallest accumulated error metric. Once this information is built up, the Viterbi decoder is ready to recreate the sequence of bits that were input to the convolutional encoder when the message was encoded for transmission. This is accomplished by the following steps: (1) select the state having the smallest accumulated error metric and save the state number of that state; (2) iteratively perform the following step until the beginning of the trellis is reached—working backward to the state history table, for the selected state, select a new state which is listed in the state history table as being the predecessor to that state then save the state number of each selected state (this is called traceback); and (3) work forward through a list of selected states saved in the previous steps—look up what input bit corresponds to a transition from each predecessor state to its successor state (that is the bit that must have been encoded by the convolutional encoder). In addition, the smallest accumulated error metric in the final state indicates how many channel symbol errors occurred during transmission and reception of the encoded signal. However, it is not necessary to build the trellis for the entire message before starting traceback. For longer messages, or continuous data, it is neither practical nor desirable, due to memory constraints and decoder delay. The traceback depth for the Viterbi decoder is usually sufficient at 5 times the constraint length parameter used in the convolutional encoding. Deeper tracebacks increase decoding delay and decoder memory requirements, while not significantly improving the performance of the decoder. Of course, an exception to this is punctured codes which require deeper tracebacks to reach their final performance limits. The above example used a convolutional code rate of ½, constraint length of 3, and a memory length of 2.

Viterbi decoders and encoding schemes are used in many applications and devices. For example, such a device might be a computer system wherein a Viterbi decoder is used in the system to decode data signals received from a modem. Telephone line modems can use a trellis-coded modulation to squeeze high ratios of bits-per-second to Hertz out of a 3 kHz bandwith analog telephone line.

FIG. 1 illustrates one example of a computer system. In FIG. 1, microprocessor die 2 may comprise many subblocks, such as arithmetic logic unit (ALU) for an on-die cache 6. Microprocessor 2 may also communicate to other levels of cache, such as off-die cache 8. Higher memory hierarchy levels, such as system memory 10, are accessed via host buss 12 and chip set 14. In addition, other off-die functional units, such as graphics accelerator 16, network interface controller (NIC) 18, and modem 20, to name just a few, may communicate with microprocessor 2 via appropriate busses or ports. In this example, a Viterbi decoder may be included in microprocessor 2 for decoding encoded signals received from modem 20. The decoder can also be placed between any two devices that use encoded communication.

Figure 2:
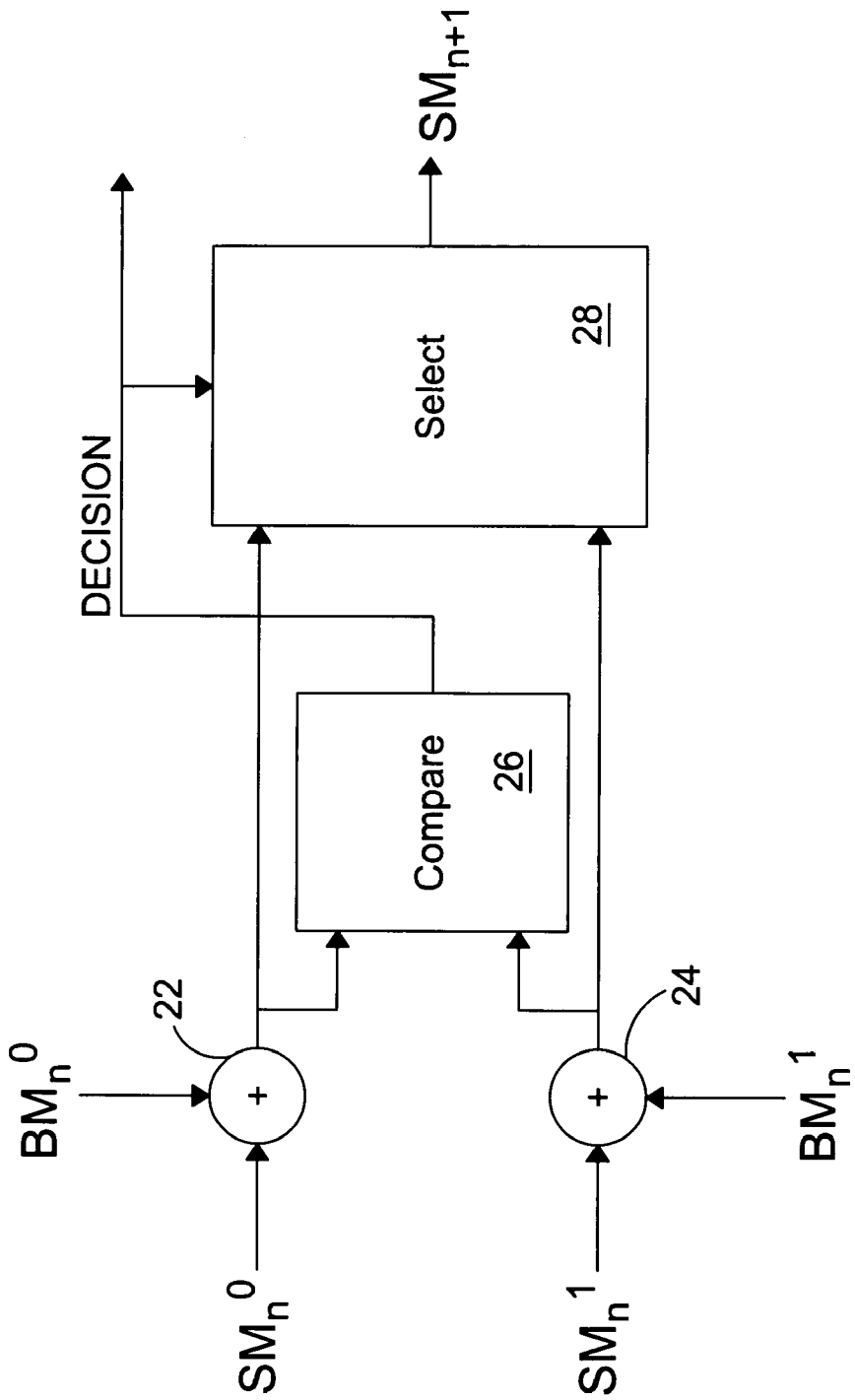
FIG. 2 illustrates a general ACS circuit.

In a Viterbi decoder, the add-compare-select (ACS) unit performs state metric updates for every symbol cycle. For instance, one example of an ACS circuit is illustrated in FIG. 2. As shown in FIG. 2, the ACS circuit includes first and second adders 22, 24 to add the state metrics corresponding to a likely input symbol of zero and one ($SM_n^0$ and $SM_n^1$) to respective branch metrics ($BM_n^0$ and $BM_n^1$). A compare circuit 26 is provided to compare the results of the addition $SM^0$ and $BM^0$ to the results of the addition of $SM^1$ and $BM^1$. Finally, a selection circuit 28 is provided to select the smaller result of the comparison for the next state metric, $SM_{n+1}$.

The present invention relates to a decoding circuit that includes an ACS component. The ACS component may include a first adder, a second adder, a comparator, a multiplexer, a storage unit, and an inverter. The first and second adders each may have a state input, branch input, and an output. The comparator may have a pair of adder inputs and an output wherein the adder inputs are coupled to the output of the adders. The multiplexer may have a pair of inputs, a select input, and an output wherein the pair of inputs are coupled to the adder outputs and the select input is coupled to the comparator output. The storage unit may be coupled to the multiplexer output to store the output from the multiplexer. The inverter may be coupled between the second adder output and one of the pair of multiplexer inputs corresponding to the second adder output.

Figure 3:
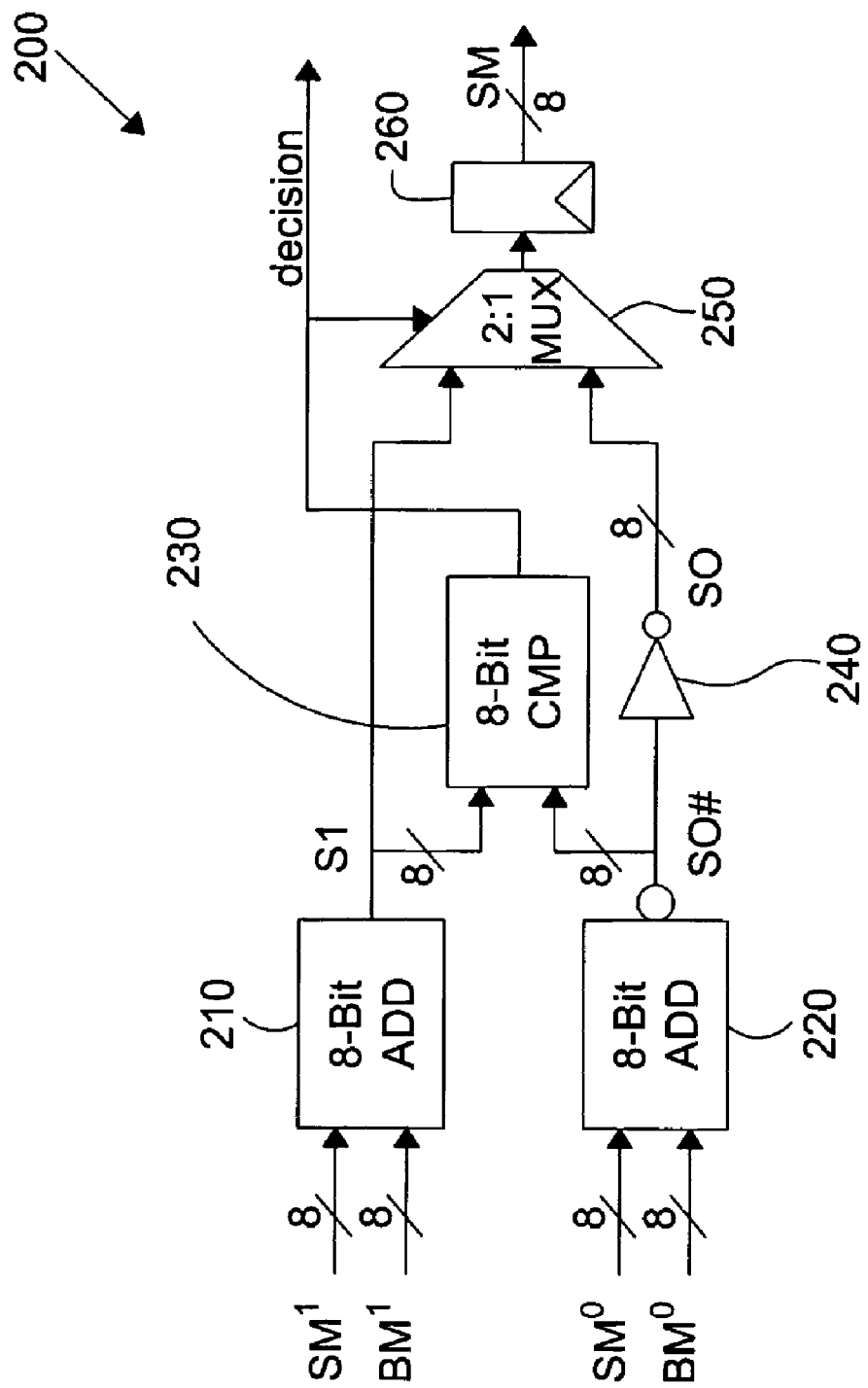
FIG. 3 illustrates an ACS for a 64-state Viterbi decoder according to one embodiment.

One embodiment of the present invention is illustrated in FIGS. 3–8. This embodiment includes an ACS 200 for a 64-state Viterbi decoder with 5-decision inputs. Referring to FIG. 3, the ACS 200 may include first and second parallel adders 210, 220 to receive and add 8-bit state metrics ($SM^0$ and $SM^1$), corresponding to a likely input symbol of 0 and 1, and corresponding branch metrics ($BM^0$ and $BM^1$). First adder 210 adds the 8-bit $SM^1$ and the 8-bit $BM^1$ and outputs the result as S1. The second adder 220 adds 8-bit $SM^0$ and 8-bit $BM^0$ and outputs the inverted result as S0#. An 8-bit parallel comparator 230 may receive the outputs S0#, S1 of the first and second parallel adders 210, 220 to generate a multiplexer select (decision) signal. In order to enable a subtract operation in the comparator 230, the output from the second parallel adder 220 is inverted (referred to as S0#) prior to forwarding to the comparator 230. Consequently, an inverter 240 is provided to restore the original signal S0 so that output signals S0 and S1 are provided to multiplexer 250. The multiplexer 250 may comprise 8 2:1 multiplexers, and receive an output of the comparator 230 (select signal) to select one of the two input signals (S0, S1) as an output signal. Finally, an 8-bit flip-flop 260 receives and stores the corresponding result from the selected adder. The data stored in FF 260 corresponds to the accumulated error metrics.

Figure 4:
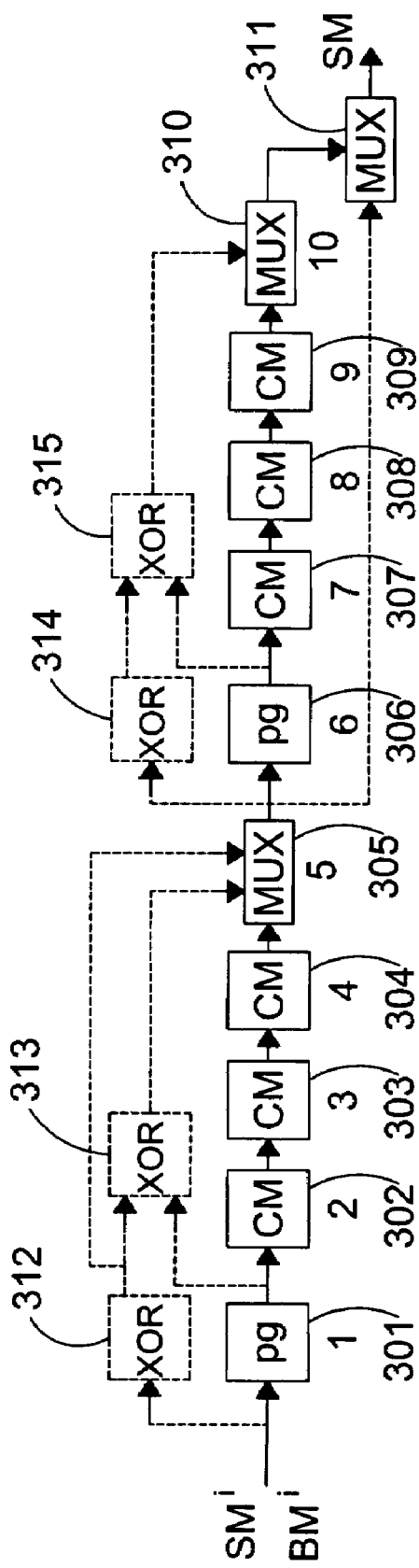
FIG. 4 illustrates the overall critical path of the ACS unit of FIG. 3 according to one embodiment.

FIG. 4 shows the overall critical path of the ACS 200 unit according to the embodiment, with the non-critical sidepaths shown in dotted lines. The ACS 200 critical path according to this embodiment has 11 logic stages. These include 5 logic stages in the adders 210 and 220, 5 logic stages in the comparator 230, and 1 logic stage in the final multiplexer 250 (shown as element 311). Recall that the result of one adder is inverted to enable a subtract operation in the comparator. The 5 logic stages in the adder may include a propagate and generate circuit 301, carry merge circuits 302–304 and a multiplexer 350. The 5 logic states in the comparator may include a propagate and generate circuit 306, carry merge circuits 307–309 and a multiplexer 310. The non-critical sidepaths include XOR gates 312–315 as shown in FIG. 4.

Figure 5:
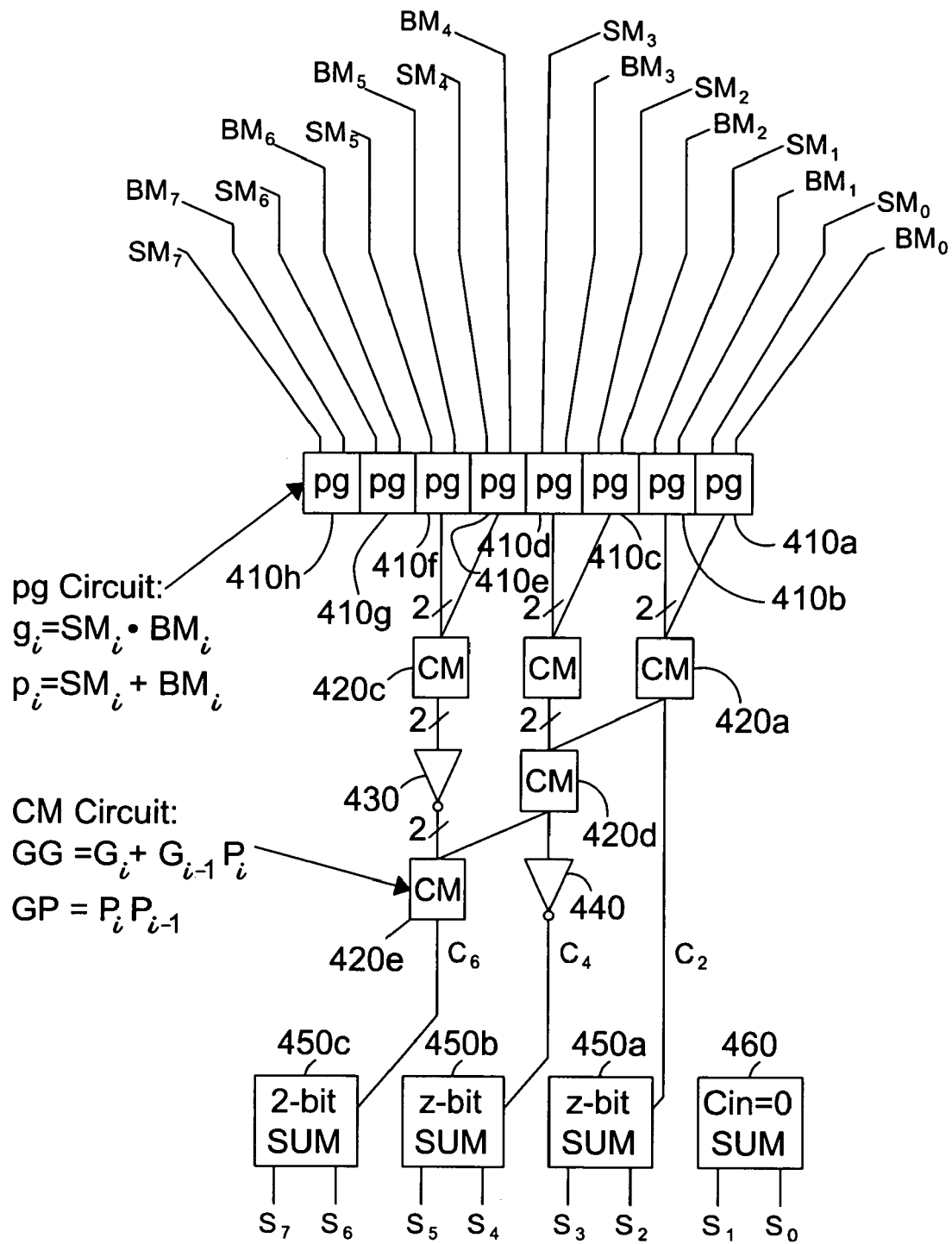
FIG. 5 illustrates additional detail of each of the 8-bit parallel adders of the ACS unit of FIG. 3 according to one embodiment.

FIG. 5 illustrates additional detail of each of the 8-bit parallel adders 210, 220. As shown in FIG. 5, the adder may be preferably embodied using a sparse-tree structure to achieve fast energy efficient computation. The sparse-tree generates the even carries C2, C4, and C6.

Referring to FIG. 5, the comparator may include a plurality of propagate and generate (PG) circuits 410a–410h coupled to receive respective state metric and branch metric inputs SM and BM. Specifically, the first PG circuit 410a may receive signals $SM_0$ and $BM_0$, the second PG circuit 410b may receive signals $SM_1$ and $BM_1$, and so on through the eighth PG circuit 410h, which may receive signals $SM_7$ and $BM_7$. $SM_i$ and $BM_i$ represent the $i^{th}$ bit of the SM and BM symbols.

Each of the PG circuits preferably operates to generate a propagation value $p_i$ and a generate value $g_i$ for each of the input combinations. Each of the values is calculated as follows.

$$g_i=(SM_i)\times(BM_i) \quad \text{equation 1}$$

$$p_i=(SM_i)+(BM_i) \quad \text{equation 2}$$

Outputs $g_0$, $p_0$, $g_1$, and $p_1$ of the first and second PG circuits 410a, 410b may be provided to first carry-merge (CM) circuit 420a. Similarly, outputs of the third and fourth PG circuits 410c, 410d may be provided to the second CM circuit 420b, while outputs of the fifth and sixth PG circuits 410e, 410f may be provided to the third CM circuit 420c.

An output of the third CM circuit 420c may be provided to an inverter 430 and outputs of the first and second CM circuits 420a, 420b may be provided to a fourth CM circuit 420d. An output of the inverter for 430 and an output of the fourth CM circuit 420d may be provided to a fifth CM circuit 420e. Additionally, an output of the fourth CM circuit 420d may be provided to an inverter 440.

Each of the CM circuits operates to generate two carry-merge values for each input combination provided. The two values calculated are:

$$GG=Gi+Gi_{i-1}P_i \quad \text{equation 3}$$

$$GP=P_iP_{i-1} \quad \text{equation 4}$$

The above described PG circuits, CM circuits, and inverters are used to generate even carry bits $C_2$, $C_4$, and $C_6$. Specifically, an output of the first CM circuit 420a is the second carry bit $C_2$, an output of the second inverter 440 is the fourth carry bit $C_4$, and an output of the fifth CM circuit 420e is the sixth carry bit $C_6$.

Finally, each of the 8-bit parallel adders 210, 220 may include three 2-bit sum circuits 450a, 450b, 450c, as well as a sum circuit for a Cin input carry bit equal to 0 (Cin=0) 460. The Cin=0 sum circuit 460 generates first and second sum bits ($S_0$, $S_1$), the first 2-bit sum circuit 450a generates the third and fourth sum bits ($S_2$, $S_3$), the second 2-bit sum circuit 450b generates fifth and sixth sum bits ($S_4$, $S_5$), and the third 2-bit sum circuit 450c generates seven and eighth sum bits ($S_6$, $S_7$).

Figure 6:
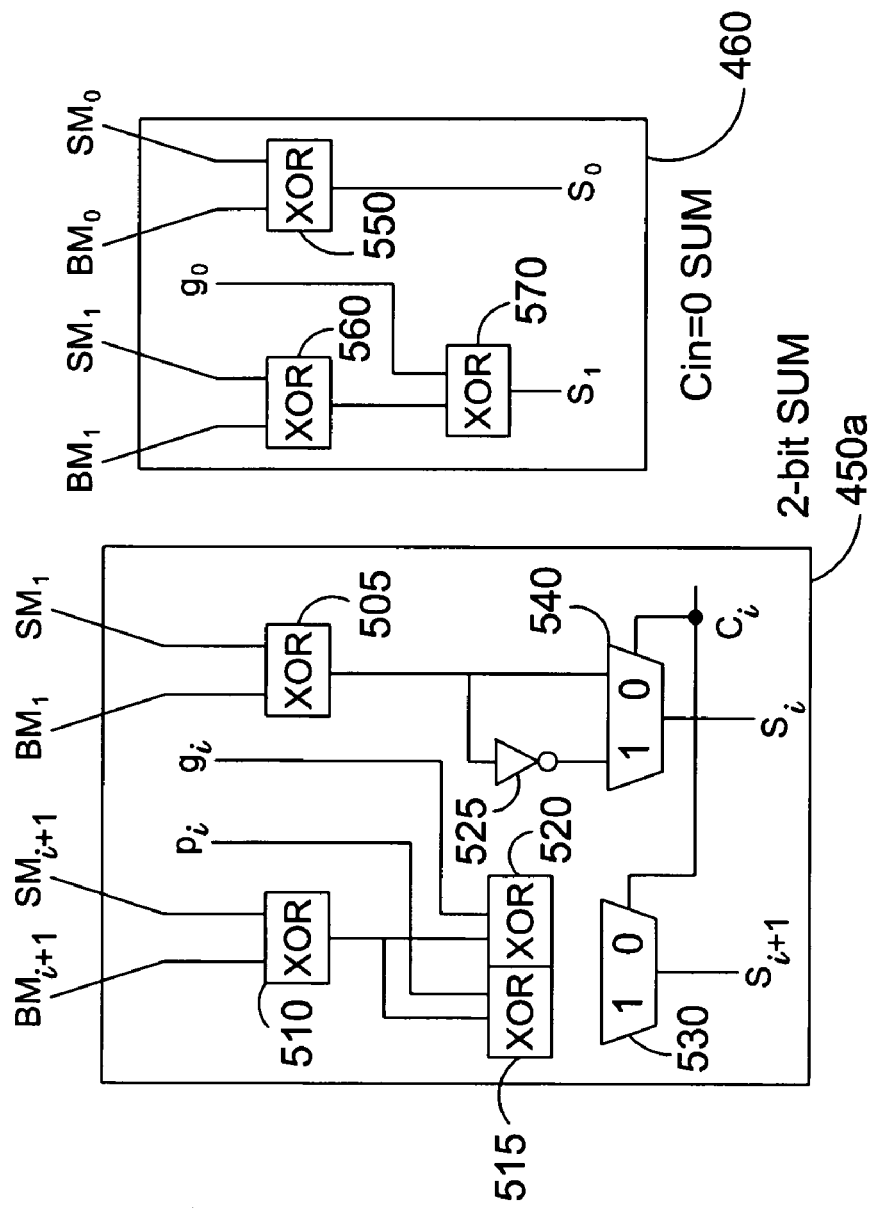
FIG. 6 illustrates additional detail of the 2-bit SUM circuit and Cin=0 SUM circuit of FIG. 5 according to one embodiment.

FIG. 6 shows additional detail of the 2-bit sum circuit and Cin=0 sum circuit of FIG. 5. Thus, as shown in FIG. 6, a parallel sidepath pre-computes 2-bit conditional sums corresponding to the conditions when the even carry is assumed to be a 0 and when the even carry is assumed to be a 1. When the even carries are resolved, they select between the conditional sums in a 2:1 multiplexer to generate the final sum. The total critical path for the addition has 5 logic stages: 4 from the carry-merge structure and 1 for the final multiplexer. The circuit for the inverted addition is the same, except that the partial-sum XOR gates are replaced by XNOR gates.

Thus, referring to FIG. 6, each of the two-bit sum circuits may include first and second XOR gates 505, 510 to respectively receive ith SM and BM symbols and ith+1 SM and BM symbols. An output and an inverted output of the first XOR gate 505 may be provided to a first multiplexer 540. Additionally, an output of the second XOR gate 510 may be provided to both a third and fourth XOR gate 515, 520. Additionally, the value of $p_i$ may be provided to the third XOR gate 515, and a value of $g_i$ may be provided to the fourth XOR gate 520. Outputs from each of the third and fourth XOR gates 515, 520 may be provided to a second multiplexer 530. The first and second multiplexer may also receive the associated carry value, which determines which output to provide. Accordingly, the first multiplexer 540 outputs a value of $S_i$ and the second multiplexer 530 outputs a value of $S_{i+1}$.

The Cin=0 sum circuit generates the values for $S_0$ and $S_1$. Specifically, $BM_0$ and $SM_0$ are provided to XOR 550 to output $S_0$. Additionally, $BM_1$ and $SM_1$ are provided to XOR 560. An output of XOR 560 and a value of $g_0$ are provided to XOR 570 to generate $S_1$.

Figure 7:
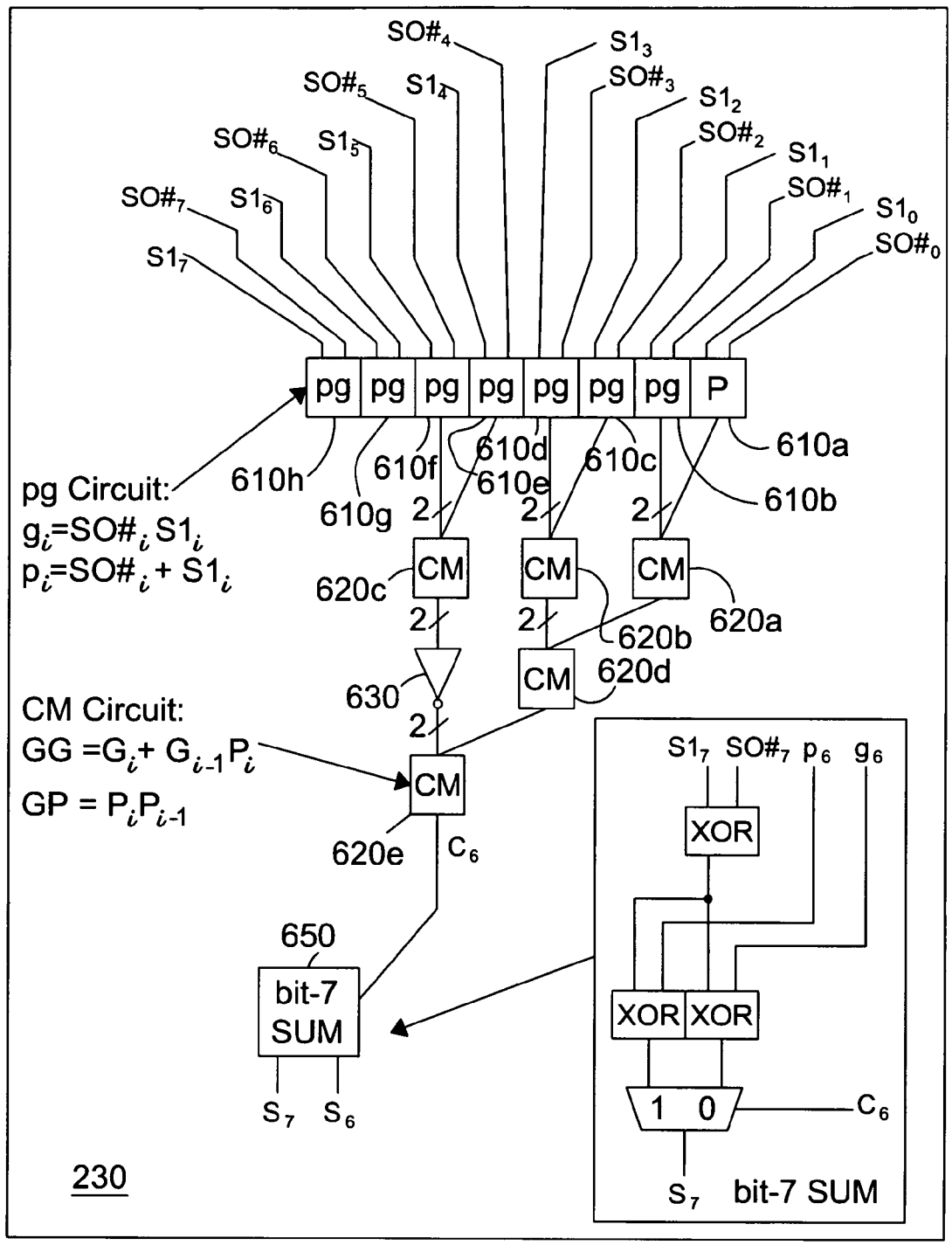
FIG. 7 illustrates additional detail of the compare unit of FIG. 3 according to one embodiment.

Next, additional detail of one embodiment of a comparator circuit is described, such as that shown in FIG. 7. Referring to FIG. 7, a comparator circuit using a simplified adder for subtraction is provided.

The comparator may include a plurality of PG circuits 610a–610h coupled to receive respective outputs S1 and S0# of the first and second adders 210, 220. Specifically, the first PG circuit 610a receives output signals $S1_0$ and $S0\#_0$, the second PG circuit 610b receives output signals $S1_1$ and $S0\#_1$, and so on through the eighth PG circuit 610h, which receives output signals $S1_7$ and $S0\#_7$.

Each of the PG circuits may operate to generate a propagation value $p_i$ and a generate value $g_i$ for each of the input combinations. Each of the values is calculated as follows.

$$g_i=(S0\#_i)(S1_i) \quad \text{equation 5}$$

$$p_i=(S0\#_i)+(S1_i) \quad \text{equation 6}$$

Outputs $g_0$, $p_0$, $g_1$, and $p_1$ of the first and second PG circuits 610a, 610b may be provided to first CM circuit 620a. Similarly, outputs of the third and fourth PG circuits 610c, 610d may be provided to the second CM circuit 620b, while outputs of the fifth and sixth PG circuits 610e, 610f may be provided to the third CM circuit 620c. Outputs of the first and second CM circuit may be provided to a fourth CM circuit, while an output of the third CM circuit may be provided to an inverter. An output of the inverter and an output of the fourth CM circuit may be provided to a fifth CM circuit, which in turn generates the sixth carry bit $C_6$.

A decision is obtained from the most-significant-bit (MSB) sum. Due to the nature of the subtraction, two things need to be taken care of. First, one of the inputs needs to be inverted. This inversion is done in the previous add stage. Second, a carry-in of 1 is assumed to bit 0. Therefore, the propagate signal of bit 0 (instead of the generate) is input to the bit-0-to-1 carry-merge. In addition, since only the MSB sum is needed, all unused gates for other bits are removed to reduce loading on the critical path and to save area. Similar to the add unit, the critical path in the comparator has 5 logic stages.

Thus, the bit-7 sum circuit may receive $S1_7$ and $/S0\#_7$. These values may be provided to a first XOR gate. An output of the first XOR date may be provided to second and third XOR gates. Additionally, the second XOR gate may receive the value $p_6$, and the third XOR may receive the value $g_6$. The output of the second and third XOR gates may be provided to a multiplexer, which receives the sixth carry bit $C_6$, and outputs the bit 7 sum, $S_7$.

Figure 8:
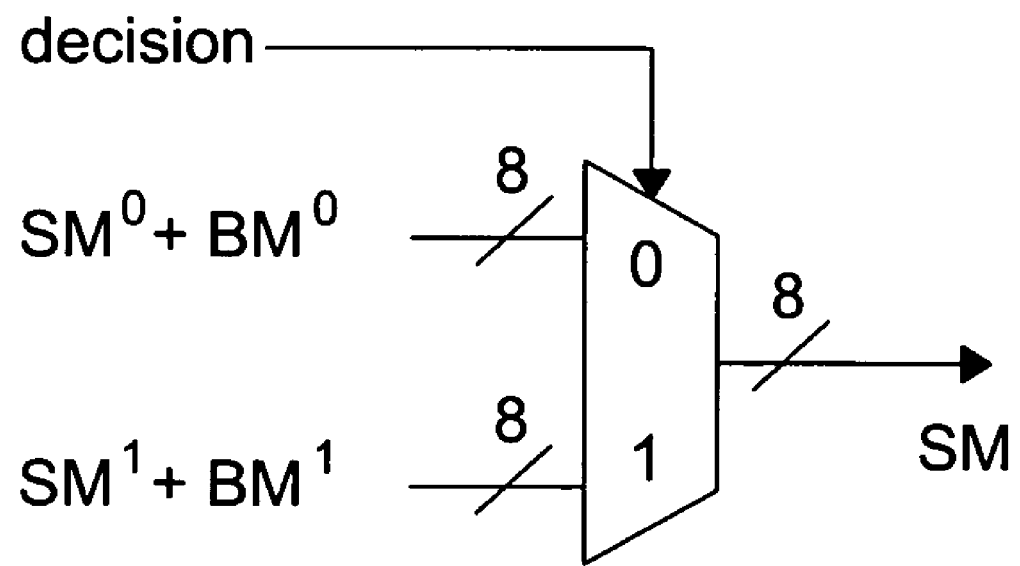
FIG. 8 illustrates additional detail of the multiplexer of the ACS unit of FIG. 3 according to one embodiment.

FIG. 8 illustrates additional detail of the multiplexer 250 of FIG. 3. The multiplexer 250 is the final selection stage, and may comprise eight 2:1 multiplexers, which receive the results of the first and second parallel adders 210, 220, as well as the decision signal from the comparator 230. Output signal SM is then provided to the 8-bit flip-flop 260 for storage.

Figure 9:
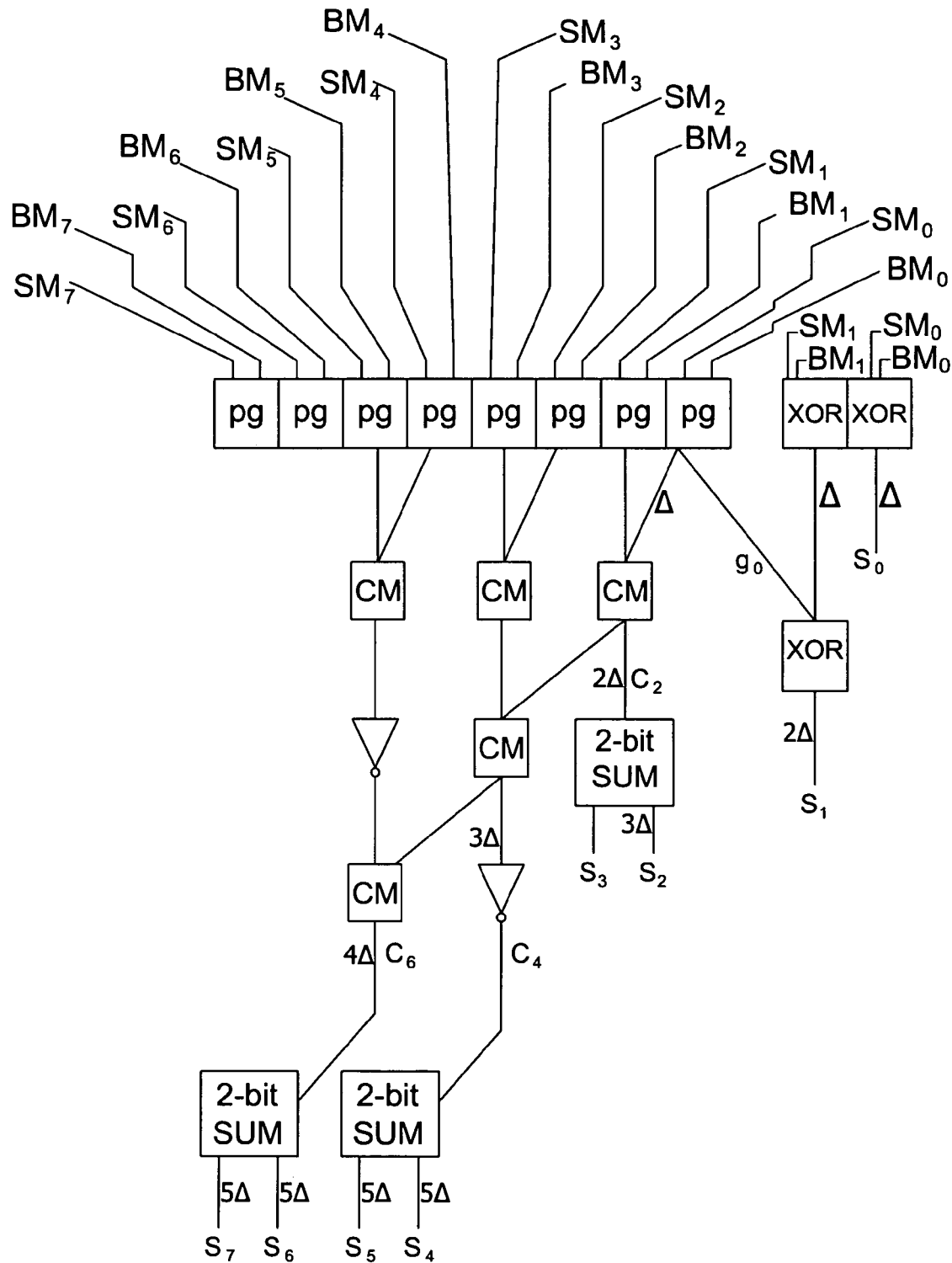
FIG. 9 illustrates the delay profile of the adder of FIG. 3 according to one embodiment.
Figure 10:
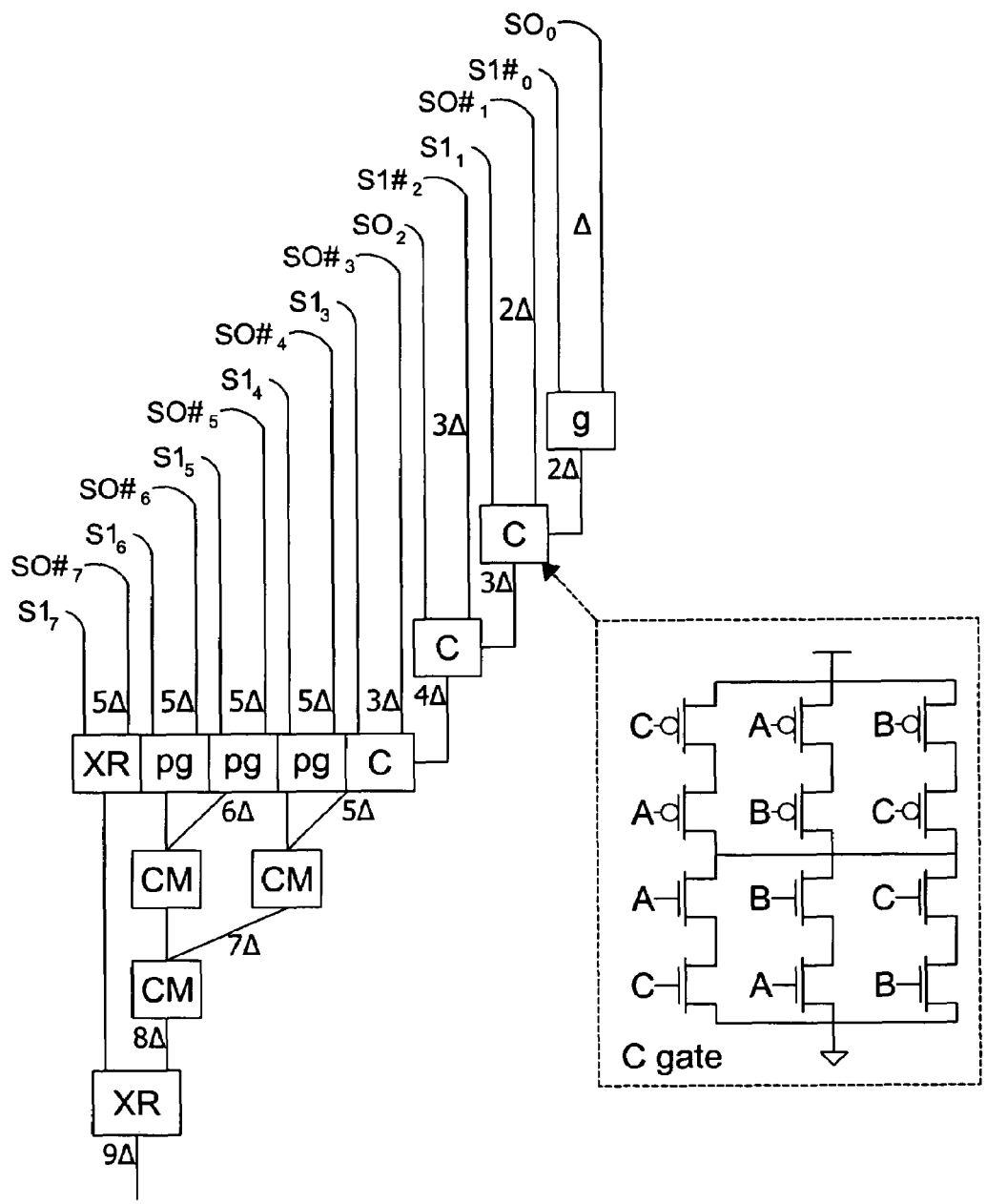
FIG. 10 illustrates a delay profile of the compare unit of FIG. 3 according to one embodiment.
Figure 11:
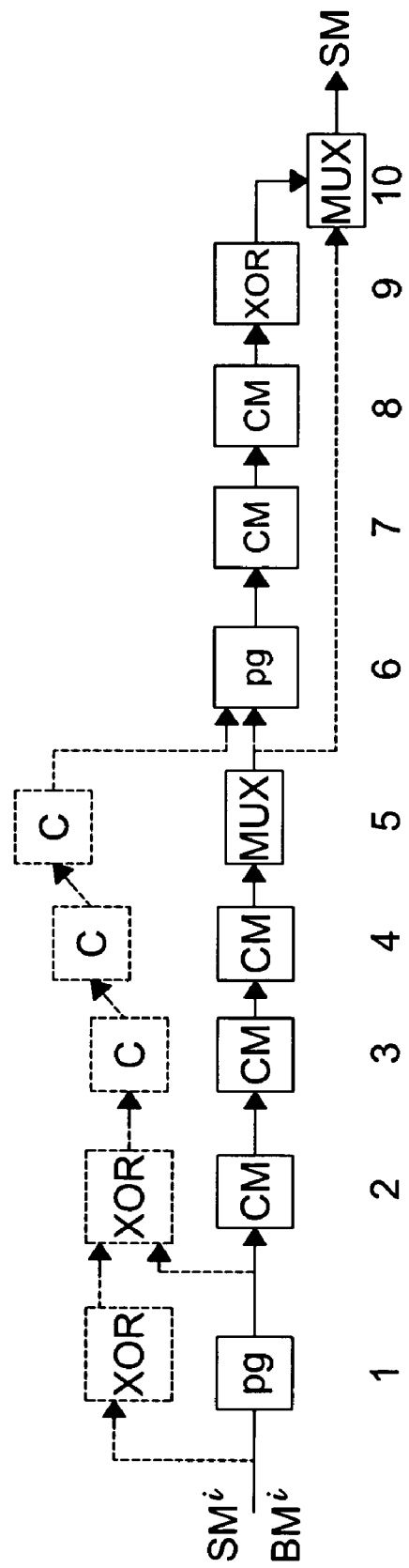
FIG. 11 illustrates the overall critical path of the ACS unit of FIG. 2 according to one embodiment.

Another embodiment of the present invention is illustrated in FIGS. 9–11. By using a delay profile of the sum outputs of the adder, the logical stages in the compare unit can be reduced. One example of a delay profile of the add unit is illustrated in FIG. 9. As shown in FIG. 9, the lower order sum bits $S_0$, $S_1$, $S_2$, and $S_3$ are available at times $\Delta$, $2\Delta$, $3\Delta$, and $4\Delta$, respectively ($\Delta$=Stage delay). The upper-level sum bits $S_4$, $S_5$, $S_6$, and $S_7$ are available at time $5\Delta$.

Referring to FIG. 10, since results of the lower order sum bits are available early compared to the upper order bits, the compare unit can compute them early in a ripple manner. It is noted that bits 0 and 2 are inverted so that the compare result at bit 3 matches the polarity of the results from the add unit. When the results of bits 4 through 7 are ready from the add unit, the compare result up to bit 3 is also complete. Therefore, the comparison can continue only on the remaining 4 bits, 4 through 7. Accordingly, it is done in 4 stages, instead of 5. As a result, the ACS according to this embodiment has a total of 10 logic stages: 5 in add units, 4 in comparator unit and 1 in final multiplexer, as shown in FIG. 11.

The fast bit-parallel add-compare-select circuit according to the embodiments described herein has many advantages. For example, the speed of the ACS circuit is increased, while the power consumption and clock power are reduced. In addition, the operating frequency is the same as the symbol rate. Hence, the high-cost of generating an internal higher-frequency clock is avoided.

The foregoing embodiments describe a hardware implementation of a Viterbi decoding method. However, it should be understood the described embodiments may be implemented entirely by software or a combination of hardware and software.

The foregoing embodiments and advantages are merely exemplary and are not to be construed as limiting the present invention. The present teaching can be readily applied to other types of apparatuses. The description of the prevent invention is intended to be illustrative, and not to limit the scope of the claims. Many alternatives, modifications, and variations will be apparent to those skilled in the art.

What is claimed is:

1. A decoding circuit, comprising:
   a first adder having a first state input, a first branch input, and a first adder output, the first adder adding the first state input and the first branch input to generate the first adder output;
   a second adder having a second state input, a second branch input, and a second adder output, the second adder adding the second state input and the second branch input to generate the second adder output;
   a comparator having a first adder input, a second adder input, and a comparator output, the comparator comparing the first adder input and the second adder input to generate the comparator output;
   a multiplexer having a first multiplexer input, a second multiplexer input, a select input, and a multiplexer output, the multiplexer selecting one of the first multiplexer input and the second multiplexer input based on the select input to generate the multiplexer output;
   a storage unit coupled to the multiplexer output, the storage unit storing the multiplexer output; and
   an inverter coupled between the second adder output and the second multiplexer input, the inverter inverting the second adder output.

2. The decoder circuit as claimed in claim 1, wherein the first adder output is coupled to the first adder input and the first multiplexer input, the second adder output is coupled to the second adder input and the second multiplexer input through the inverter, and the comparator output is coupled to the select input.

3. The decoder circuit as claimed in claim 2, further comprising:
   a first state signal coupled to the first state input;
   a first branch signal coupled to the first branch input;
   a second state signal coupled to the second state input; and
   a second branch signal coupled to the second branch input.

4. The decoder circuit as claimed in claim 3, wherein the first state signal, the second state signal, the first branch signal, and the second branch signal are each 8 bit signals, and the first adder, the second adder, and the comparator are configured in parallel for the 8 bit signals.

5. The decoder circuit as claimed in claim 1, wherein an operating frequency of the decoder circuit is the same as a symbol rate.

6. The decoder circuit as claimed in claim 1, wherein the decoder circuit performs a state metric update every symbol cycle.

7. The decoder circuit as claimed in claim 1, further comprising five decision inputs.

8. The decoder circuit as claimed in claim 7, wherein the decoder circuit has a critical path of eleven logic states.

9. The decoder circuit as claimed in claim 7, wherein the decoder circuit has a critical path of ten logic states.

10. An add-compare-select circuit, comprising:
    an adder having a plurality of inputs and a plurality of outputs, the adder adapted to add the plurality of inputs at an operating frequency, the plurality of inputs including a plurality of state metric inputs and a plurality of branch metric inputs;
    a comparator coupled to the adder, the comparator adapted to compare the plurality of outputs at the operating frequency; and
    a selector coupled to the comparator and the adder, the selector adapted to select at least one of the plurality of outputs at the operating frequency, the operating frequency approximately equals a symbol rate.

11. The circuit as claimed in claim 10, wherein the circuit performs a state metric input update for every symbol cycle.

12. The circuit as claimed in claim 10, further comprising a storage adapted to store the selected at least one of the plurality of outputs.

13. A add-compare-select circuit, comprising:
an adder having a plurality of inputs and a plurality of outputs, the adder adapted to add the plurality of inputs at an operating frequency;
a comparator coupled to the adder, the comparator adapted to compare the plurality of outputs at the operating frequency; and
a selector coupled to the comparator and the adder, the selector adapted to select at least one of the plurality of outputs at the operating frequency, the selector having a plurality of decision inputs, and the operating frequency approximately equaling a symbol rate.

14. The circuit as claimed in claim 13, wherein the circuit has a number of logic states in a critical path equal to twice the plurality of decision inputs.

15. The circuit of claim 14, wherein the adder has a number of logic states in the critical path equal to the plurality of decision inputs, the comparator has a number of logic states in the critical path equal to one less than the plurality of decision inputs, and the selector has one logic state.

16. The circuit of claim 13, wherein the circuit has a number of logic states in a critical path equal to one more than twice the plurality of decision inputs.

17. The circuit of claim 16, wherein the adder has a number of logic states in the critical path equal to the plurality of decision inputs, the comparator has a number of logic states in the critical path equal to the plurality of decision inputs, and the selector has one logic state.

18. The circuit as claimed in claim 10, wherein the adder further comprises a propagate generate component, a plurality of carry merge components, and a multiplexer.

19. The circuit as claimed in claim 10, wherein the comparator further comprises a propagate generate component, a plurality of carry merge components, and a multiplexer.

20. A method for data detection, comprising:
receiving data at a data rate;
adding a first branch metric and a first state metric at the data rate;
adding a second branch metric and a second state metric at the data rate;
generating a first output signal based on the addition of the first branch metric and the first state metric at the data rate;
generating a second output signal based on the addition of the second branch metric and the second state metric at the data rate;
comparing the first output signal and the second output signal at the data rate;
generating a select signal based on the comparison of the first output signal and the second output signal at the data rate; and
selecting one of the first output signal and the second output signal based on the select signal.

21. The method as claimed in claim 20, further comprising storing the selected one of the first output signal and the second output signal.

22. The method as claimed in claim 20, wherein the data rate approximately equals a symbol rate.

23. The method as claimed in claim 20, wherein the received data comprises the first state metric and the second state metric.

24. The method as claimed in claim 23, further comprising updating the first state metric and the second state metric every symbol cycle.

25. The method as claimed in claim 20, further comprising adding a plurality of state metrics and a plurality of branch metrics; generating a plurality of output signals based on the addition of the plurality of state metrics and the plurality of branch metrics; comparing the plurality of output signals; generating a plurality of select signals based on the comparison of the plurality of output signals; and selecting a plurality of the plurality of output signals based on the plurality of select signals.

26. A system comprising:
a die comprising a microprocessor; and
an off-die component in communication with the microprocessor;
wherein the microprocessor includes an add-compare-select circuit; having:
an adder having a plurality of inputs and a plurality of outputs, the adder adapted to add the plurality of inputs at an operating frequency, the plurality of inputs including a plurality of state metric inputs and a plurality of branch metric inputs, and
a comparator coupled to the adder component, the comparator adapted to compare the plurality of outputs at the operating frequency, and
a selector coupled to the comparator and the adder, the selector adapted to select at least one of the plurality of outputs at the operating frequency, the operating frequency approximately equals a symbol rate.

27. The system as claimed in claim 26, wherein the adder comprises:
a first adder having a first state input, a first branch input, and a first adder output; and
a second adder having a second state input, a second branch input, and a second adder output,
the comparator comprises a comparator having a first adder input, a second adder input, and a comparator output,
the selector comprises a multiplexer having a first multiplexer input, a second multiplexer input, a select input, and a multiplexer output, and
the microprocessor further includes a storage unit coupled to the multiplexer output and an inverter coupled between the second adder output and the second multiplexer input.

28. The system as claimed in claim 27, wherein the first adder output is coupled to the first adder input and the first multiplexer input, the second adder output is coupled to the second adder input and the second multiplexer input through the inverter, and the comparator output is coupled to the select input.

* * * * *